United States Patent
Kim et al.

(10) Patent No.: US 10,115,479 B2
(45) Date of Patent: Oct. 30, 2018

(54) MEMORY DEVICE, MEMORY SYSTEM AND METHOD OF VERIFYING REPAIR RESULT OF MEMORY DEVICE

(71) Applicant: Samsung Electronics Co., Ltd., Suwon-si (KR)

(72) Inventors: Seok-Jung Kim, Seoul (KR); Young-Uk Chang, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 120 days.

(21) Appl. No.: 15/249,928

(22) Filed: Aug. 29, 2016

(65) Prior Publication Data

US 2017/0148529 A1 May 25, 2017

(30) Foreign Application Priority Data

Nov. 20, 2015 (KR) .................. 10-2015-0163295

(51) Int. Cl.
*G11C 29/00* (2006.01)
*G11C 29/44* (2006.01)
*G11C 29/10* (2006.01)
*G11C 29/24* (2006.01)
*G11C 29/04* (2006.01)

(52) U.S. Cl.
CPC .............. *G11C 29/44* (2013.01); *G11C 29/10* (2013.01); *G11C 29/24* (2013.01); *G11C 29/76* (2013.01); *G11C 2029/0403* (2013.01)

(58) Field of Classification Search
None
See application file for complete search history.

(56) References Cited

U.S. PATENT DOCUMENTS

| 5,708,601 | A | | 1/1998 | McKenny et al. | |
|---|---|---|---|---|---|
| 5,848,009 | A | * | 12/1998 | Lee | G11C 29/765 365/200 |
| 6,145,092 | A | | 11/2000 | Beffa et al. | |
| 7,457,167 | B2 | * | 11/2008 | Patrascu | G11C 16/3468 365/185.09 |

(Continued)

FOREIGN PATENT DOCUMENTS

KR   1369362 B   3/2014

*Primary Examiner* — Daniel McMahon
(74) *Attorney, Agent, or Firm* — Muir Patent Law, PLLC

(57) ABSTRACT

A memory device that includes a memory cell array and control circuit in which the memory cell array includes a normal region including a first failed block and a redundant region including a first redundant block replacing the first failed block. The control circuit includes a mapping table storing replacement information. The control circuit refers to the mapping table for accessing the first redundant block. When testing the memory device, the control circuit writes "1" in the normal region and the first redundant block, writes "0" in the redundant region except the first redundant block, adds the replacement information regarding a second failed block and second redundant block in the redundant region to the mapping table and verifies the result of replacing the second failed block with the second redundant block based on entire data read from the memory cell array with respect to entire range assigned to the address signal.

20 Claims, 15 Drawing Sheets

(56) References Cited

U.S. PATENT DOCUMENTS

| | | | | |
|---|---|---|---|---|
| 7,755,956 B2* | 7/2010 | Ohta | ............... | G11C 29/44 |
| | | | | 365/200 |
| 7,930,592 B2* | 4/2011 | Ouellette | ............... | G11C 29/14 |
| | | | | 365/200 |
| 8,683,276 B2 | 3/2014 | Chou et al. | | |
| 8,762,801 B1 | 6/2014 | Lee et al. | | |
| 9,626,244 B2* | 4/2017 | Sohn | ............... | G06F 11/1052 |
| 2001/0056557 A1* | 12/2001 | Kawagoe | ............... | G11C 29/44 |
| | | | | 714/723 |
| 2009/0175072 A1 | 7/2009 | Choi et al. | | |
| 2015/0089327 A1* | 3/2015 | Youn | ............... | G06F 11/1048 |
| | | | | 714/768 |

* cited by examiner

FIG. 3

| ADDR | TARGET BLK |
|---|---|
| 000 | NOR_BLK_1 |
| 001 | REP_BLK_1 (MODIFIED) |
| 010 | NOR_BLK_3 |
| 011 | NOR_BLK_4 |
| 100 | NOR_BLK_5 |
| 101 | NOR_BLK_6 |
| 110 | NOR_BLK_7 |
| 111 | NOR_BLK_8 |

FIG. 7

| ADDR | TARGET BLK |
|---|---|
| 000 | NOR_BLK_1 |
| 001 | REP_BLK_1 (MODIFIED) |
| 010 | NOR_BLK_3 |
| 011 | NOR_BLK_4 |
| 100 | NOR_BLK_5 |
| 101 | NOR_BLK_6 |
| 110 | REP_BLK_2 (MODIFIED) |
| 111 | NOR_BLK_8 |

FIG. 8

| ADDR | READ DATA |
|---|---|
| 000 | 1 1 1 1 ⋯ 1 1 1 1 |
| 001 | 1 1 1 1 ⋯ 1 1 1 1 |
| 010 | 1 1 1 1 ⋯ 1 1 1 1 |
| 011 | 1 1 1 1 ⋯ 1 1 1 1 |
| 100 | 1 1 1 1 ⋯ 1 1 1 1 |
| 101 | 1 1 1 1 ⋯ 1 1 1 1 |
| 110 | 0 0 0 0 ⋯ 0 0 0 0 — DATA1 |
| 111 | 1 1 1 1 ⋯ 1 1 1 1 |

REPAIR SUCCESS

FIG. 9

| ADDR | READ DATA |
|---|---|
| 000 | 1 1 1 1 ⋯ 1 1 1 1 |
| 001 | 1 1 1 1 ⋯ 1 1 1 1 |
| 010 | 1 1 1 0 ⋯ 1 1 1 1 |
| 011 | 1 1 1 1 ⋯ 1 1 1 1 |
| 100 | 1 1 1 1 ⋯ 1 1 1 1 |
| 101 | 1 1 1 1 ⋯ 1 1 1 1 |
| 110 | 0 0 1 0 ⋯ 0 1 0 0 — DATA1 |
| 111 | 1 1 1 1 ⋯ 1 1 1 1  (REPAIR FAIL) |

SELECT THE SECOND REDUNDANT BLOCK AMONG THE REDUNDANT REGION EXCEPT THE FIRST REDUNDANT BLOCK BY REFERRING TO THE MAPPING TABLE —S141

WHEN ALL OF THE PORTION DATA CORRESPONDING TO THE SECOND REDUNDANT BLOCK HAVE THE SECOND LOGIC VALUE AND ALL OF THE REST DATA EXCEPT THE PORTION DATA HAVE THE FIRST LOGIC VALUE, DETERMINES THAT AN ERROR IS NOT INCLUDED IN THE RESULT OF REPLACING THE SECOND FAILED BLOCK WITH THE SECOND REDUNDANT BLOCK —S151

WHEN PORTION DATA CORRESPONDING TO THE SECOND REDUNDANT BLOCK HAVE THE FIRST LOGIC VALUE OR THE REST DATA EXCEPT THE PORTION DATA HAVE THE SECOND LOGIC VALUE, DETERMINES THAT AN ERROR IS INCLUDED IN THE RESULT OF REPLACING THE SECOND FAILED BLOCK WITH THE SECOND REDUNDANT BLOCK —S152

MEMORY DEVICE, MEMORY SYSTEM AND METHOD OF VERIFYING REPAIR RESULT OF MEMORY DEVICE

CROSS-REFERENCE TO RELATED APPLICATION

This U.S. Non-provisional application claims priority under 35 USC § 119 to Korean Patent Application No. 10-2015-0163295, filed on Nov. 20, 2015, in the Korean Intellectual Property Office (KIPO), the disclosure of which is incorporated by reference in its entirety herein.

BACKGROUND

1. Technical Field

Exemplary implementations of the herein disclosed subject matter relate generally to semiconductor devices and, more particularly, to a memory device in which when an additional failed block is caused after a primary repair of failed blocks is completed a secondary repair is performed and verification of the secondary repair is carried out.

2. Discussion of the Related Art

As the process scale of manufacturing memory devices, such as dynamic random access memory (DRAM), static random access memory (SRAM), flash memory, etc., has been reduced, the number of failed memory cells has increased significantly. A memory cell array of the memory device may include a normal region and a redundant region. Failed blocks found in the redundant region during an electrical die sorting (EDS) test in a wafer stage may be deactivated and not used. Also a primary repair may be performed during the EDS test such that failed blocks found in the normal region may be replaced with redundant blocks in the redundant region.

Additional failed blocks may be caused after the wafer is cut and the cut dies are packaged. In this case, a secondary repair in the package stage and verification of the secondary repair is required

SUMMARY

Some exemplary implementations may provide a memory device and a memory system which performs a secondary repair in a package stage when an additional failed block is caused after a primary repair of failed blocks in a wafer stage is completed, and which verifies the result of the secondary repair.

Some exemplary implementations may provide a method of performing a secondary repair in a package stage when an additional failed block is caused after a primary repair of failed blocks in a wafer stage is completed and verifying the result of the secondary repair.

According to exemplary implementations, a memory device includes a memory cell array and a control circuit. The memory cell array includes a normal region and a redundant region. The normal region may include a first failed block and the redundant region may include a first redundant block replacing the first failed block. The control circuit includes a test mode register and a mapping table storing replacement information between the first failed block and the first redundant block. The control circuit refers to the mapping table and accesses the first redundant block when an address signal corresponds to the first failed block. When the test mode register is activated and the normal region further includes a second failed block, the control circuit writes a first logic value in the normal region and the first redundant block, writes a second logic value in the redundant region except in the first redundant block, adds the replacement information between the second failed block and a second redundant block in the redundant region to the mapping table and verifies a result of replacing the second failed block with the second redundant block based on the entire data read from the memory cell array with respect to an entire range assigned to the address signal.

When all of the portion data corresponding to the second redundant block among the entire data having the second logic value and all the rest of the data except the portion data among the entire data having the first logic value, the control circuit may determine that an error is not included in the result of replacing the second failed block with the second redundant block.

When portion data corresponding to the second redundant block among the entire data having the first logic value or the rest of the data except the portion data among the entire data having the second logic value, the control circuit may determine that an error is included in the result of replacing the second failed block with the second redundant block.

According to exemplary implementations, a memory system includes a memory device and a processor configured to provide an address signal, a data signal and a command signal to the memory device The memory device includes a memory cell array including a normal region and a redundant region, the normal region including a first failed block, the redundant region including a first redundant block replacing the first failed block and a control circuit including a test mode register and a mapping table storing replacement information between the first failed block and the first redundant block, the control circuit configured to refer to the mapping table and access the first redundant block when the address signal corresponds to the first failed block. When a stored value in the test mode register is activated and the normal region further includes a second failed block, the control circuit writes a first logic value in the normal region and the first redundant block, writes a second logic value in the redundant region except in the first redundant block, adds the replacement information between the second failed block and a second redundant block in the redundant region to the mapping table and verifies a result of replacing the second failed block with the second redundant block based on entire data read from the memory cell array with respect to an entire range assigned to the address signal to generate a verification result signal.

When all of the portion data corresponding to the second redundant block among the entire data having the second logic value and all of the rest of the data except the portion data among the entire data having the first logic value, the control circuit may determine that an error is not included in the result of replacing the second failed block with the second redundant block and activates the verification result signal.

When portion data corresponding to the second redundant block among the entire data having the first logic value or the rest of the data except the portion data among the entire data have the second logic value, the control circuit may determine that an error is included in the result of replacing the second failed block with the second redundant block and deactivates the verification result signal.

According to exemplary implementations, a method of verifying a repair result of a memory device is provided. The memory device includes a memory cell array including a normal region and a redundant region where the normal region includes a first failed block and the redundant region includes a first redundant block replacing the first failed block and a control circuit including a test mode register and a mapping table storing replacement information between the first failed block and the first redundant block. The method includes activating a stored value of the test mode register, determining whether the normal region further includes a second failed block, writing a first logic value in the normal region and the first redundant block and writing a second logic value in the redundant region except in the first redundant block, when the normal region further includes the second failed block, adding the replacement information between the second failed block and a second redundant block in the redundant region to the mapping table and when the normal region further includes the second failed block, verifying a result of replacing the second failed block with the second redundant block based on entire data read from the memory cell array with respect to an entire range assigned to the address signal.

Adding the replacement information between the second failed block and the second redundant block may include selecting the second redundant block among the redundant region except for the first redundant block by referring to the mapping table.

Verifying the result of replacing the second failed block with the second redundant block may include, when all of portion data corresponding to the second redundant block among the entire data having the second logic value and all of the rest of the data except the portion data among the entire data having the first logic value, determining that an error is not included in the result of replacing the second failed block with the second redundant block.

Verifying the result of replacing the second failed block with the second redundant block may include, when portion data corresponding to the second redundant block among the entire data having the first logic value or the rest of data except for the portion data among the entire data having the second logic value, determining that an error is included in the result of replacing the second failed block with the second redundant block.

The memory device and the memory system may enhance yield of products by performing a secondary repair in a package stage and verifying a result of the secondary repair when an additional failed block is caused after the memory device and/or the memory system is packaged.

BRIEF DESCRIPTION OF THE DRAWINGS

Exemplary implementations of the present disclosure will be more clearly understood from the following detailed description taken in conjunction with the accompanying drawings.

FIG. 3 is a diagram illustrating initial information of a mapping table included in the memory device of FIG. 1.

FIG. 7 is a diagram illustrating a mapping table in case that a second failed block is replaced with a second redundant block in a redundant region in the memory device of FIG. 1.

FIG. 8 is a diagram illustrating data read from a memory cell array in case that an error does not occur after a second failed block is replaced with a second redundant block.

FIG. 9 is a diagram illustrating data read from a memory cell array in case that an error occurs after a second failed block is replaced with a second redundant block.

FIG. 14 is a diagram illustrating an example of adding replacement information to a mapping table in the method of FIG. 13.

FIG. 15 is a diagram illustrating an example of verifying a result of replacing a second failed block with a second redundant block in the method of FIG. 13.

DETAILED DESCRIPTION OF THE EMBODIMENTS

Figure 1:
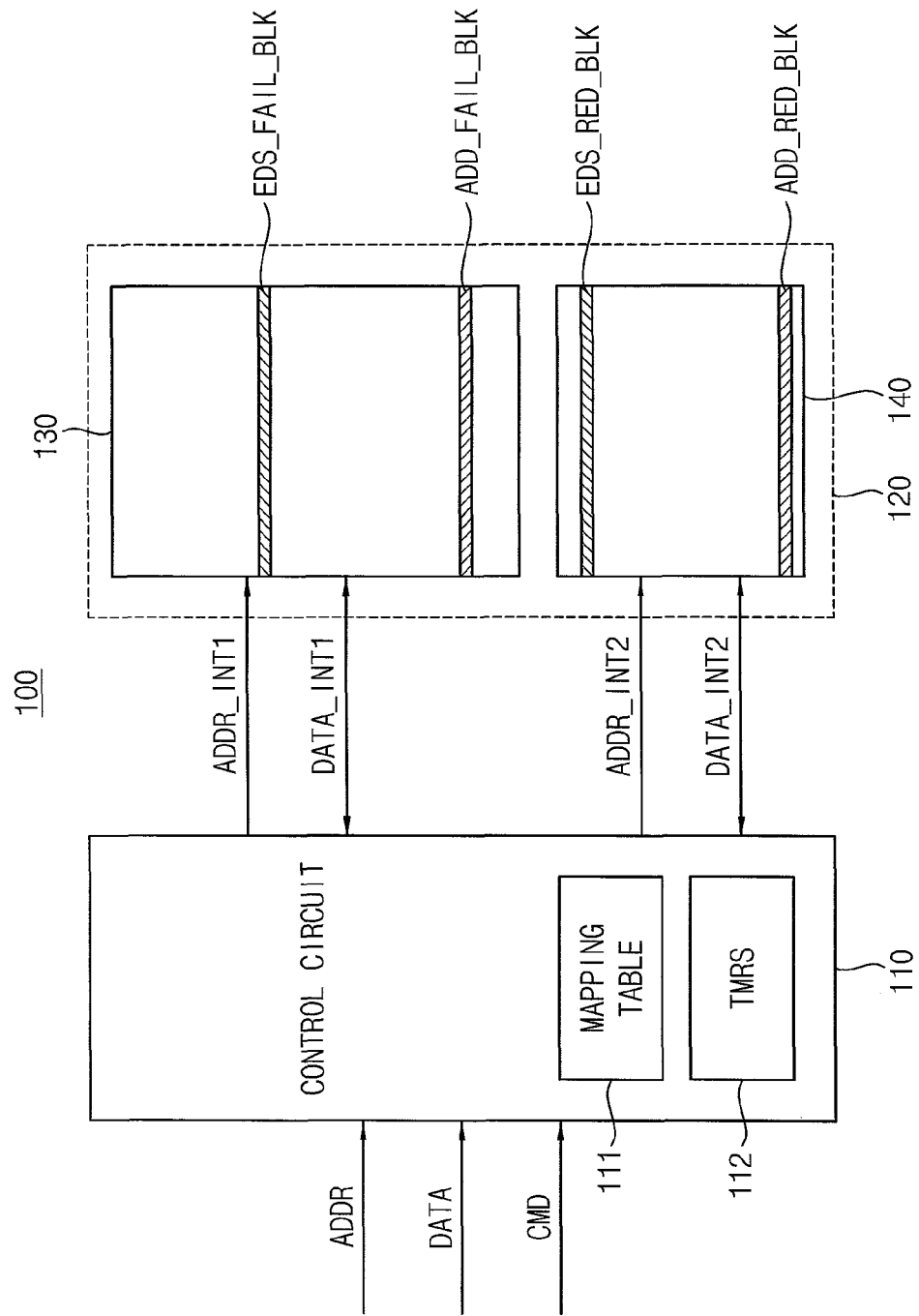
FIG. 1 is a block diagram illustrating a memory device according to exemplary implementations.

Various exemplary implementations will be described more fully hereinafter with reference to the accompanying drawings, in which some exemplary implementations are shown. The present disclosure may, however, be embodied in many different forms and should not be construed as limited to the exemplary implementations set forth herein. Rather, these exemplary implementations are provided so that this disclosure will be thorough and complete, and will fully convey the scope of the present disclosure to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, components, and/or sections, these elements, components, and/or sections should not be limited by these terms. Unless the context indicates otherwise, these terms are only used to distinguish one element, component, or section from another element, component, or section, for example as a naming convention. Thus, a first element, component, or section discussed below in one section of the specification could be termed a second element, component, or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to another element, it can be directly connected or coupled to the other element or intervening elements may be present.

The terminology used herein is for the purpose of describing particular exemplary implementations only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As is traditional in the field of the disclosed technology, features and embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a memory device according to exemplary implementations.

As shown in FIG. 1, a memory device 100 may include a control circuit 110 and a memory cell array 120. The memory cell array 120 may include a normal region 130 and a redundant region 140.

Figure 2:
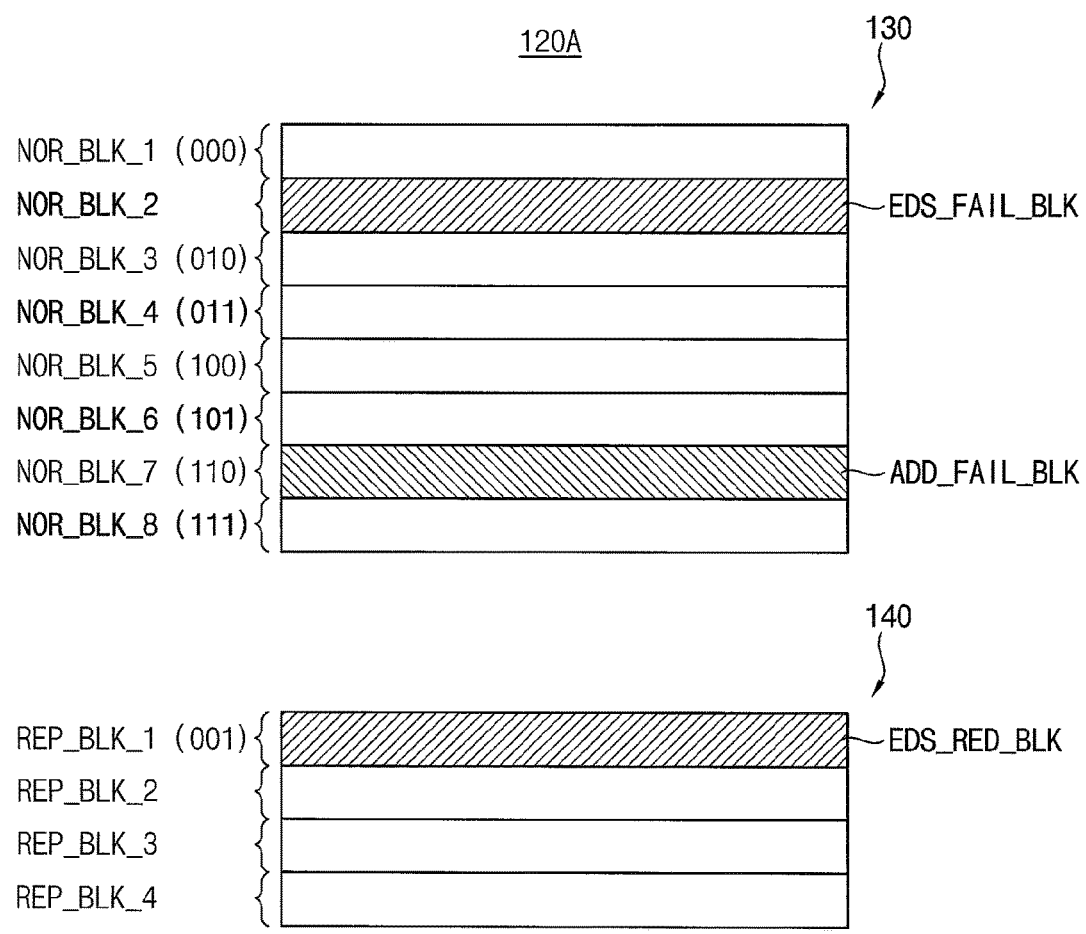
FIG. 2 is a diagram illustrating a memory cell array in case that a normal region included in the memory device of FIG. 1 includes an additional second failed block.

As shown in FIG. 2, the normal region 130 may include a first failed block EDS_FAIL_BLK. For example, the first failed block EDS_FAIL_BLK may include failed memory cells connected to at least one first wordline in the normal region 130. The redundant region 140 may include a first redundant block EDS_RED_BLK for replacing the first failed block EDS_FAIL_BLK. For example, the first redundant block EDS_RED_BLK may include redundant memory cells connected to at least one second wordline in the redundant region 140.

The control circuit 110 may include a mapping table 111 and a test mode register TMRS 112. The mapping table 111 may store replacement information regarding the first failed block EDS_FAIL_BLK and the first redundant block EDS_RED_BLK, such as the address of the first failed block EDS_FAIL_BLK and the address of first redundant block EDS_RED_BLK. The control circuit 110 may refer to the mapping table 111 and access the first redundant block EDS_RED_BLK when an address signal ADDR received from an external source corresponds to the address of the first failed block EDS_FAIL_BLK.

The memory device 100 may be tested after the memory device 100 is packaged. When the control circuit 110 receives an address signal ADDR and a command signal CMD corresponding to a test mode, the control circuit 110 may activate the test mode register 112. In other words, the control circuit 110 may activate the test mode register 112 by changing a stored value in the test mode register 112, for example, from a logic low value indicating a normal mode to a logic high value indicating the test mode. This operation mode, occurring while the test mode register 12 is activated, may be referred to as a post-package repair (PPR) mode.

When the PPR mode is activated and the normal region 130 has been determined to include a second failed block ADD_FAIL_BLK, the control circuit 110 may operates as follows: (i) write a first logic value in the normal region 130 and the first redundant block EDS_RED_BLK; (ii) write a second logic value in the redundant region 140 except in the first redundant block EDS_RED_BLK; (iii) add the replacement information regarding a newly detected second failed block ADD_FAIL_BLK and a second redundant block ADD_RED_BLK in the redundant region 140 to the mapping table 111; and (iv) verify a result of replacing the second failed block ADD_FAIL_BLK with the second redundant block ADD_RED_BLK based on reading the entire data from the memory cell array 120 with respect to an entire range assigned to the address signal ADDR. Accordingly, an address of the defective block and an address of the replacement block are added to the mapping table 111, and the address of the replacement block is used in lieu of the address of the defective block.

The operation (i) will be described below with reference to FIG. 4, the operation (ii) will be described below with reference to FIG. 5, the operation (iii) will be described below with reference to FIGS. 6 and 7 and the operation (iv) will be described with reference to FIGS. 8 and 9.

In some exemplary implementations, the first logic value may be a logic high value, i.e., 1 and the second logic value may be a logic low value, i.e. 0. In other exemplary implementations, the first logic value may be 0 and the second logic value may be 1. Hereinafter exemplary implementations of the former case are described. The exemplary implementations of the latter case may be understood referring to the former case so the repeated descriptions have been omitted.

The control circuit 110 may transmit the address signal ADDR as a first internal address signal ADDR_INT1 and transmit a data signal DATA as a first internal data signal DATA_INT1 to access the normal region 130 when the externally received address signal ADDR does not correspond to block previously determined to be defective. For example, the first internal address signal ADDR_INT1 may include a row address and a column address identifying a row and column of the normal region 130. In contrast, the control circuit 110 may convert the address signal ADDR to a second internal address signal ADDR_INT2 and transmit the data signal DATA as a second internal data signal DATA_INT2 to access the redundant region 140. For example, the second internal address signal ADDR_INT2 may include a row address and a column address identifying a row and column of the redundant region 140. Although first internal address signal ADDR_INT1 and the second internal address signal ADDR_INT2 are shown as being transmitted from the control circuit 110 on separate signal lines in FIG. 1, they may be transmitted on the same signal lines (e.g., on the same internal address bus). Similarly, DATA may be transmitted as DATA_INT1 and DATA_INT2 from the control circuit 110 on the same or different signal lines. DATA_INT1 and DATA_INT2 may be the same data with the same format as the DATA exchanged with (received or transmitted to) an external source or may be reformatted (e.g., encoded, scrambled and/or appended with an error correction code).

The second failed block ADD_FAIL_BLK may include failed memory cells connected to at least one third wordline in the normal region 130. The second redundant block ADD_RED_BLK may include redundant memory cells connected to at least one fourth wordline in the redundant region 140.

Figure 6:
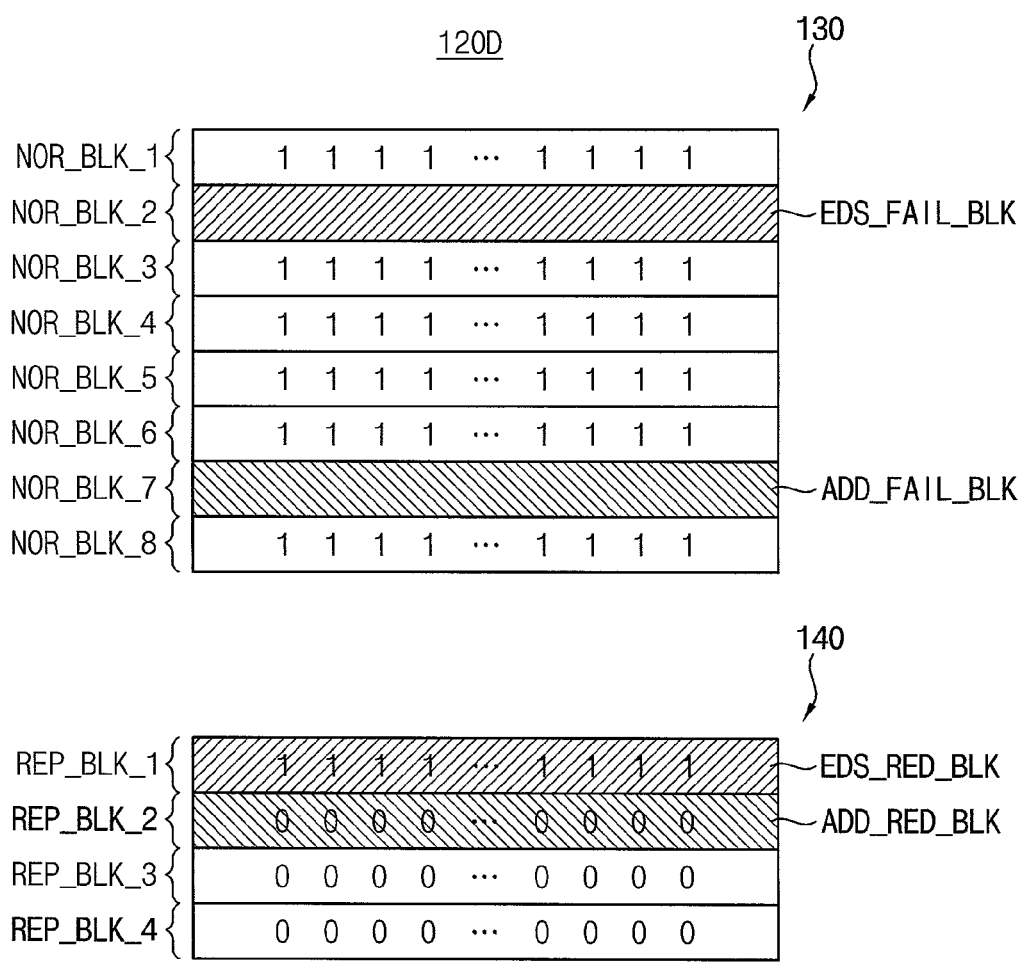
FIG. 6 is a diagram illustrating a memory cell array in case that a second failed block is replaced with a second redundant block in a redundant region in the memory device of FIG. 1.

FIG. 6 illustrates that each of the first failed block EDS_FAIL_BLK and the second failed block ADD_FAIL_BLK is located in the normal region 130 but each of the failed block EDS-FAIL-BLK and the second failed block ADD_FAIL_BLK may be distributed within the redundant region 140. Also FIG. 6 illustrates that each of the first redundant block EDS_RED_BLK and second redundant block ADD_RED_BLK is gathered in each portion of the redundant region 140 but each of the first redundant block EDS_RED_BLK and the second redundant block ADD_RED_BLK may be distributed within the normal region 130. This is the case with, for example, NAND flash memory devices which do not demarcate their memory spaces into regions, but instead allow any block to be utilized for any purpose and after a predetermined number of read operations erased and returned to the block pool of memory.

FIG. 2 is a diagram illustrating a memory cell array in case that a normal region included in the memory device of FIG. 1 includes an additional failed block. FIGS. 2, 4, 5 and 6 illustrate an exemplary implementation in which the normal region 130 of the memory cell array 120 includes eight normal blocks NOR_BLK_1 through NOR_BLK_8 and the redundant region 140 of the memory cell array 120 includes four replacement blocks REP_BLK_1 through REP_BLK_4. The normal region 130 may include an arbitrary number of normal blocks other than eight normal blocks. The cases having other than the eight normal blocks may be understood by referring to FIGS. 2, 4, 5 and 6 and thus the repeated descriptions of those cases have been omitted. Also the redundant region 140 may include an arbitrary number of replacement blocks other than the four replacement blocks. The cases having other than the four replacement blocks may be understood referring to FIGS. 2, 4, 5 and 6 and thus the repeated descriptions of those cases have been omitted.

FIGS. 2 and 3 illustrate an exemplary implementation in which 120A of the memory cell array 120 has an address signal ADDR of "000" corresponding to the first normal block NOR_BLK_1. ADDR "000" may be the address of the first normal block such that when decoded by an address decoder of the memory cell array 120, the first normal block NOR_BLK_1 is identified and/or accessed. The second normal block NOR_BLK_2 is the first failed block EDS_FAIL_BLK and is replaced with the first replacement block REP_BLK_1 (corresponding to the first redundant block EDS_RED_BLK), and thus address signal ADDR of "001" may cause accesses of the first redundant block EDS_RED_BLK (or the first replacement block REP_BLK_1). The address signal ADDR of "010", "011", "100", "101", "110" and "111" may correspond to the addresses of the third normal block NOR_BLK_3 through the eighth normal block NOR_BLK_8.

FIG. 3 is a diagram illustrating initial information of a mapping table included in the memory device of FIG. 1.

As shown in FIG. 3, the mapping table 111 may store mapping relations between the values of the address signals ADDR and memory blocks in the memory cell array 120 as described with reference to FIG. 2. The mapping table 111 stores replacement information regarding the first failed block EDS_FAIL_BLK or NOR_BLK_2 and the first redundant block EDS_RED_BLK or REP_BLK_1 for mapping the address signal ADDR of "001" to the first redundant block REP_BLK_1.

Figure 4:
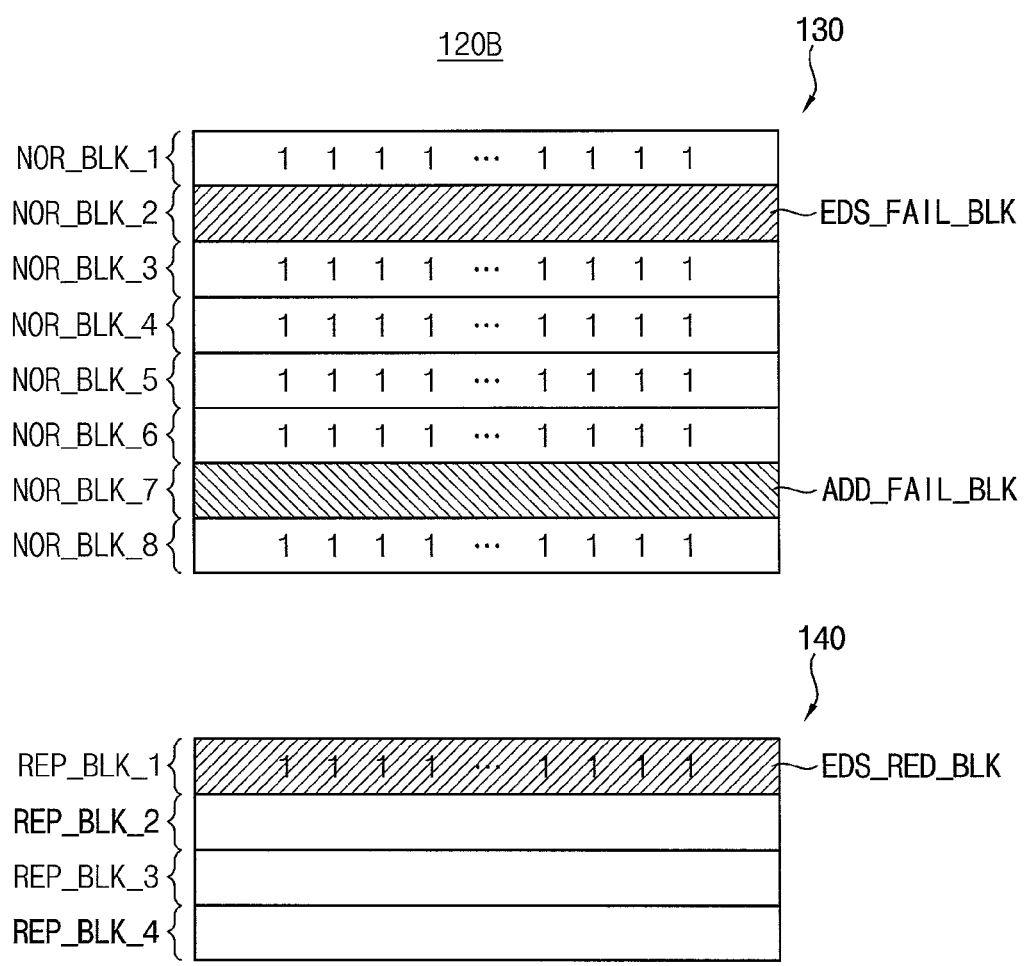
FIG. 4 is a diagram illustrating a process of writing a first logic value in a first normal region and a first redundant block in the memory device of FIG. 1.

FIG. 4 is a diagram illustrating a process of writing a first logic value in a first normal region and a first redundant block in the memory device of FIG. 1.

As shown in FIG. 4, the control circuit 110 may write a first logic value, that is, a logic high value "1" in the normal region 130 and the first redundant block EDS_RED_BLK. The control circuit 110 may write "1" in the first normal block NOR_BLK_1, the third normal block NOR_BLK_3, the fourth normal block NOR_BLK_4, the fifth normal block NOR_BLK_5, the sixth normal block NOR_BLK_6 and the eighth normal block NOR_BLK_8 that operate normally. The control circuit 110 may not write "1" in the first failed block EDS_FAIL_BLK and the second failed block ADD_FAIL_BLK that don't operate normally. FIG. 4 illustrates the state 120B of the memory cell array 120 after the control circuit 110 writes the first logic value.

Figure 5:
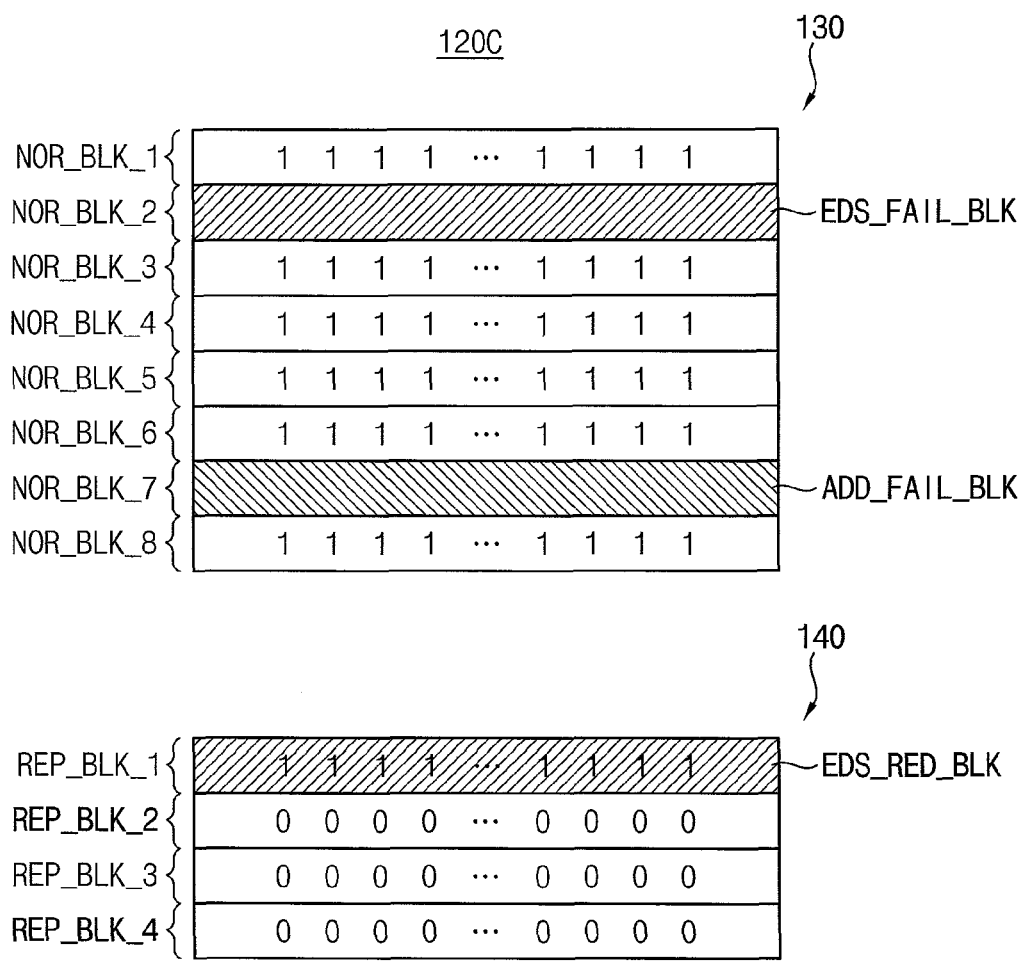
FIG. 5 is a diagram illustrating a process of writing a second logic value in a redundant region except in a first redundant block in the memory device of FIG. 1.

FIG. 5 is a diagram illustrating a process of writing a second logic value in a redundant region except a first redundant block in the memory device of FIG. 1.

As shown in FIG. 5, the control circuit 110 may write a second logic value, that is, a logic high value "0" in the redundant region 140 except the first redundant block EDS_RED_BLK. In other words, the control circuit 110 may write "0" in the second replacement block REP_BLK_2, the third replacement block REP_BLK_3 and the fourth replacement block REP_BLK_4. FIG. 5 illustrates the state 120C of the memory cell array 120 after the control circuit 110 writes the first logic value and the second logic value.

FIG. 6 is a diagram illustrating a memory cell array in case that a second failed block is replaced with a second redundant block in a redundant region in the memory device of FIG. 1, and FIG. 7 is a diagram illustrating a mapping table in case that a second failed block is replaced with a second redundant block in a redundant region in the memory device of FIG. 1.

As shown in FIGS. 6 and 7, the control circuit 110 may refer to the mapping table 111 to select the second redundant block ADD_RED_BLK among the redundant region 140 except the first redundant block EDS_RED_BLK. In other words, the control circuit 110 may select the second redundant block ADD_RED_BLK for replacing the second failed block ADD_FAIL_BLK among the second replacement block REP_BLK_2, the third replacement block REP_BLK_3 and the fourth replacement block REP_BLK_4. For example, the control circuit 110 may select the second replacement block REP_BLK_2 as the second redundant block ADD_RED_BLK as illustrated in FIGS. 6 and 7. Also the control circuit 110 may select the third replacement block REP_BLK_3 or the fourth replacement block REP_BLK_4 as the second redundant block ADD_RED_BLK.

As illustrated in FIG. 7, the mapping table 111 may store replacement information regarding the second failed block ADD_FAIL_BLK or NOR_BLK_7 and the replacement block therefor the second redundant block ADD_RED_BLK or REP_BLK_2. Accordingly, mapping table 111 maps the address signal ADDR of "110" to the second redundant block REP_BLK_2. Although mapping table 111 is shown to be populated with addresses for not failed memory blocks, i.e. ADDR of "000", "010", "011", "100", "101", and "111" this is only for illustrative purposes. In operation, mapping table 111 need not be populated with not failed memory addresses.

FIG. 8 is a diagram illustrating data read from a memory cell array in case that an error does not occur after a second failed block is replaced with a second redundant block.

FIG. 8 illustrates an example of entire data read from the memory cell array 120 with respect to an entire range assigned to the address signal of "000" through "111".

As shown in FIG. 8, all of the portion data DATA1 corresponding to the second redundant block ADD_RED_BLK among the entire data have the second logic value "0" and all of the rest data except the portion data DATA1 among the entire data have the first logic value "1". In this case, the control circuit 110 may determine that an error is not included in the result of replacing the second failed block ADD_FAIL_BLK with the second redundant block ADD_RED_BLK.

FIG. 9 is a diagram illustrating data read from a memory cell array in case that an error occurs after a second failed block is replaced with a second redundant block.

FIG. 9 illustrates another example of the entire data read from the memory cell array 120 with respect to the entire range assigned to the address signal of "000" through "111".

As shown in FIG. 9, the portion data DATA1 corresponding to the second redundant block ADD_RED_BLK among the entire data have the first logic value "1" or the rest data except the portion data DATA1 among the entire data have the second logic value "0" in the block assigned to the address signal of "010". In this case, the control circuit 110 may determine that an error is included in the result of replacing the second failed block ADD_FAIL_BLK with the second redundant block ADD_RED_BLK.

Figure 10:
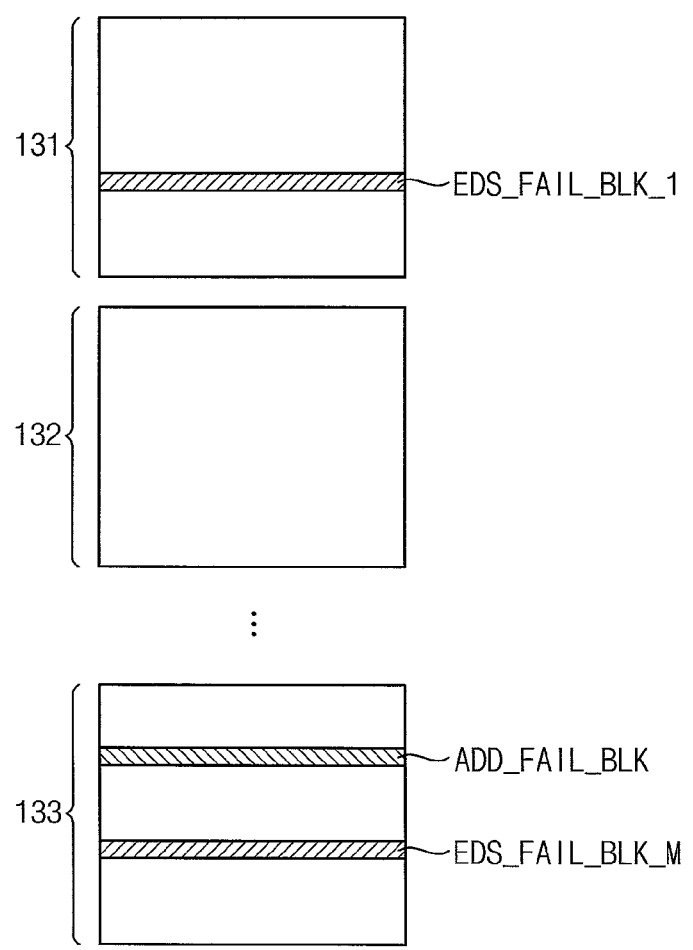
FIGS. 10 and 11 are diagrams illustrating examples of a normal region and a redundant region included in the memory device of FIG. 1.
Figure 11:
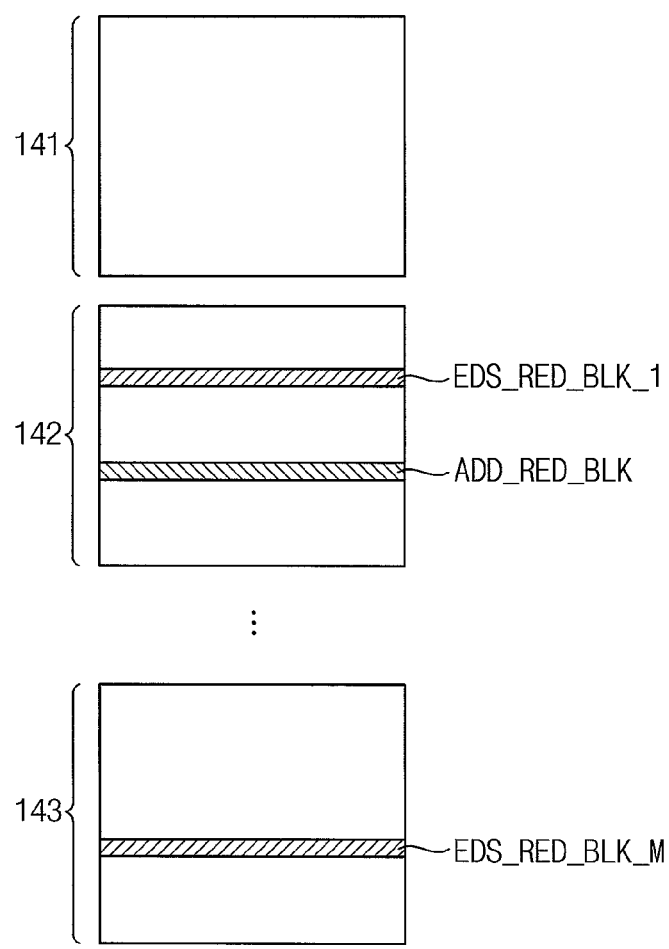

FIGS. 10 and 11 are diagrams illustrating examples of a normal region and a redundant region included in the memory device of FIG. 1.

As shown in FIG. 10, the normal region 130 may include a plurality of normal sub regions 131, 132 and 133. The normal region 130 may include a plurality of first failed blocks EDS_FAIL_BLK_1 through EDS_FAIL_BLK_M detected in the electrical die sorting (EDS) test stage and a second failed block ADD_FAIL_BLK detected in the post-package repair (PPR) stage. Each of the first failed blocks EDS_FAIL_BLK_1 through EDS_FAIL_BLK_M and the second failed block ADD_FAIL_BLK may be located in each of the normal sub regions 131, 132 and 133. These failures can occur during testing, manufacturing, after packaging, and/or after being made part of a system (i.e. after connection to a memory controller).

As shown in FIG. 11, the redundant region 140 may include a plurality of redundant sub regions 141, 142 and 143. The redundant region 140 may include a plurality of first redundant block EDS_RED_BLK_1 through EDS_RED_BLK_M for replacing the first failed blocks EDS_FAIL_BLK_1 through EDS_FAIL_BLK_M and a second redundant block ADD_RED_BLK for replacing the second failed block ADD_FAIL_BLK. Each of the first redundant block EDS_RED_BLK_1 through EDS_RED_BLK_M and the second redundant block ADD_RED_BLK may be located each of the redundant sub regions 141, 142 and 143.

Figure 12:
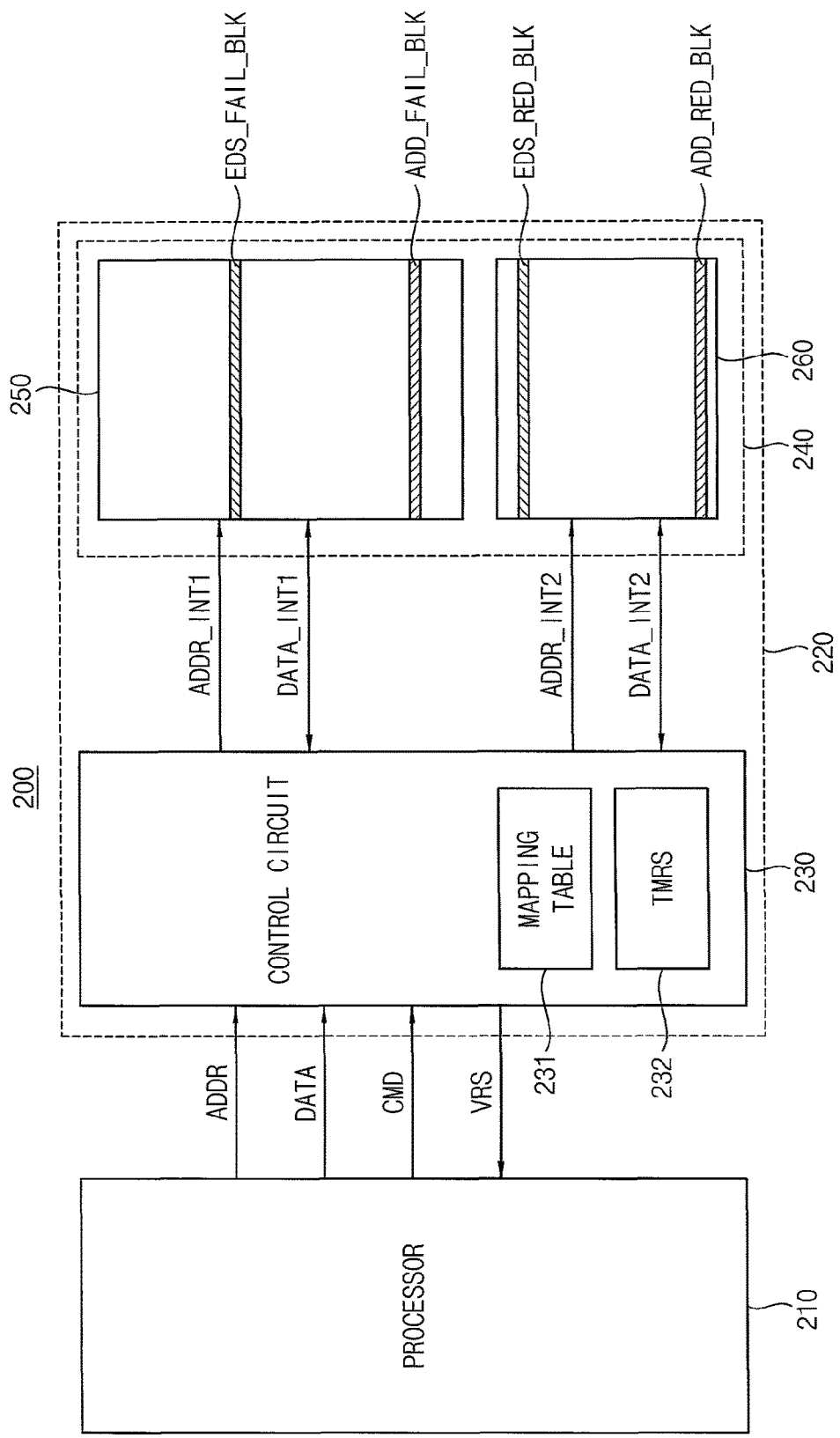
FIG. 12 is a diagram illustrating a memory system according to exemplary implementations.

FIG. 12 is a diagram illustrating a memory system according to exemplary implementations.

As shown in FIG. 12, an exemplary implementation of a memory system 200 may include a processor 210 and a memory device 220. The memory device 220 may include a control circuit 230 and a memory cell array 240. The memory cell array 240 may include a normal region 250 and a redundant region 260.

The processor 210 may provide an address signal ADDR, a data signal DATA and a command signal CMD to the memory device 220.

The normal region 250 may include a first failed block EDS_FAIL_BLK. For example, the first failed block EDS_FAIL_BLK may include failed memory cells connected to at least one first wordline in the normal region 250. The redundant region 260 may include a first redundant block EDS_RED_BLK for replacing the first failed block EDS_FAIL_BLK. For example, the first redundant block EDS_RED_BLK may include redundant memory cells connected to at least one second wordline in the redundant region 260.

The control circuit 230 may include a mapping table 231 and a test mode register TMRS 232. The mapping table 231 may store replacement information regarding the first failed block EDS_FAIL_BLK and the first redundant block EDS_RED_BLK. The control circuit 230 may refer to the mapping table 231 and access the first redundant block EDS_RED_BLK when the address signal ADDR corresponds to the first failed block EDS_FAIL_BLK.

The memory device 220 may be tested after the memory device 220 is packaged. The processor 210 may transfer the address signal ADDR and the command signal CMD corresponding to a test mode, and the control circuit 230 may activate the test mode register 232. This operation mode, while the test mode register 232 is activated, may be referred to as a post-package repair (PPR) mode.

When the test mode register 232 is activated and the normal region 250 further includes a second failed block ADD_FAIL_BLK, the control circuit 230 may operates as follows: (i) write a first logic value in the normal region 250 and the first redundant block EDS_RED_BLK; (ii) write a second logic value in the redundant region 260 except in the first redundant block EDS_RED_BLK; (iii) add the replacement information between the second failed block ADD_FAIL_BLK and a second redundant block ADD_RED_BLK in the redundant region 260 to the mapping table 231; and (iv) verify a result of replacing the second failed block ADD_FAIL_BLK with the second redundant block ADD_RED_BLK based on entire data read from the memory cell array 240 with respect to an entire range assigned to the address signal ADDR to generate a verification result signal VRS. Accordingly, an address of the second defective block and an address of the second replacement block are added to the mapping table 111, the address of the second replacement block is used in lieu of the address of the second defective block, and verification of the replacement operation is conducted.

The operation (i) may be understood as described with reference to FIG. 4, the operation (ii) may be understood as described with reference to FIG. 5, the operation (iii) may be understood as described with reference to FIGS. 6 and 7 and the operation (iv) may be understood as described with reference to FIGS. 8 and 9.

When all of portion data corresponding to the second redundant block ADD_RED_BLK among the entire data have the second logic value and all of rest data except the portion data among the entire data have the first logic value, the control circuit 230 may determine that an error is not included in the result of replacing the second failed block ADD_FAIL_BLK with the second redundant block ADD_RED_BLK as described with reference to FIG. 8. In this case, the control circuit 230 may activate the verification result signal VRS.

When portion data corresponding to the second redundant block ADD_RED_BLK among the entire data have the first logic value or the rest of the data except the portion data among the entire data have the second logic value, the control circuit 230 may determine that an error is included in the result of replacing the second failed block ADD_FAIL_BLK with the second redundant block ADD_RED_BLK as described with reference to FIG. 9. In this case, the control circuit 230 may deactivate the verification result signal VRS.

The control circuit 230 may transmit the address signal ADDR to a first internal address signal ADDR_INT1 and transmit a data signal DATA as a first internal data signal DATA_INT1 to access the normal region 250 when the externally received address signal ADDR does not correspond to a memory block previously determined to be defective. For example, the first internal address signal ADDR_INT1 may include a row address and a column address identifying a row and column of the normal region 250. In contrast, the control circuit 230 may convert the address signal ADDR to a second internal address signal ADDR_INT2 and transmit the data signal DATA as a second internal data signal DATA_INT2 to access the redundant region 260. For example, the second internal address signal ADDR_INT2 may include a row address sand a column address identifying a row and a column of the redundant region 260. Although first internal address signal ADDR_INT1 and the second internal address signal ADDR_INT2 are shown as being transmitted from the control circuit 110 on separate signal lines in FIG. 1, they may be transmitted on the same signal lines (e.g., on the same internal address bus). Similarly, DATA may be transmitted as DATA_INT1 and DATA_INT2 from the control circuit 110 on the same or different signal lines. DATA_INT1 and DATA_INT2 may be the same data with the same format as the DATA exchanged with (received or transmitted to) an external source or may be reformatted (e.g., encoded, scrambled and/or appended with an error correction code).

Figure 13:
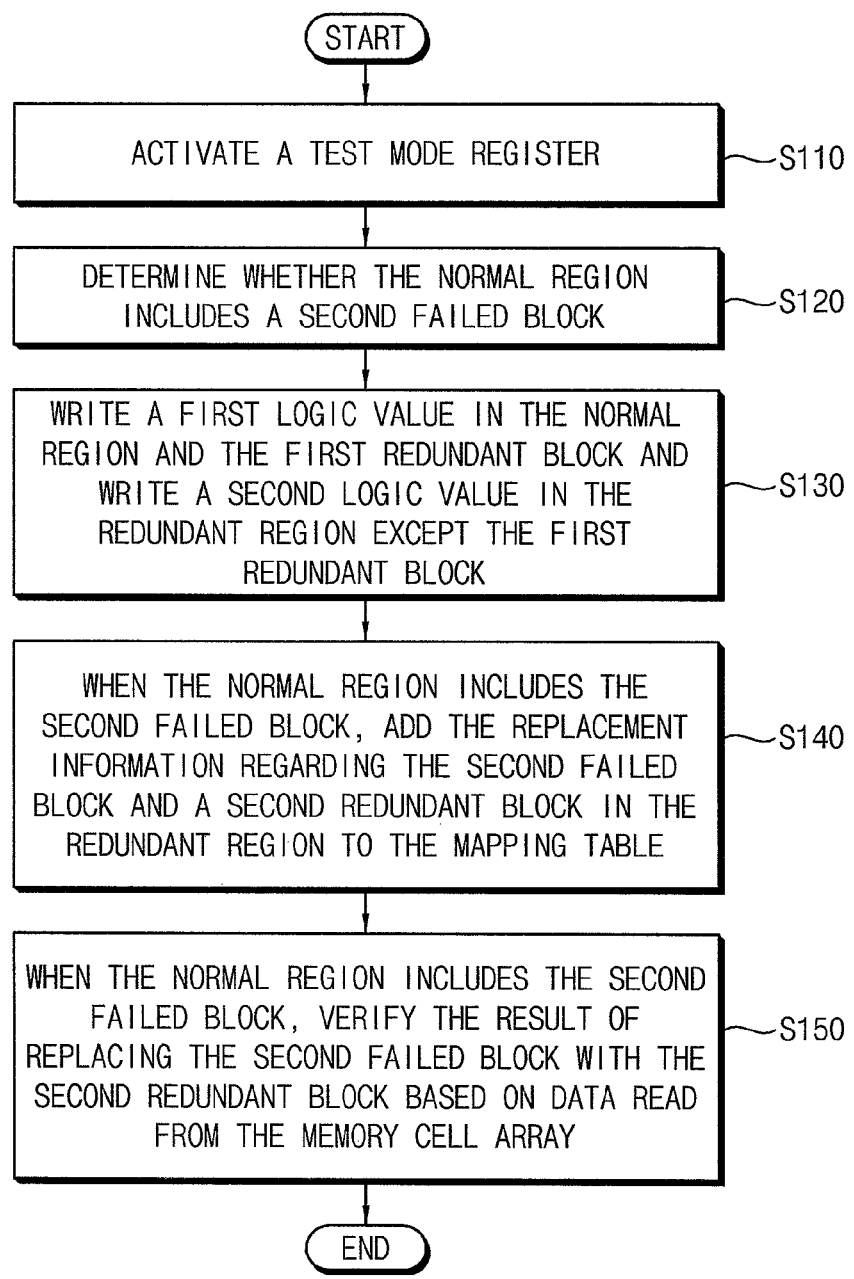
FIG. 13 is a flow chart illustrating a method of verifying a repair result of a memory device according to exemplary implementations.

FIG. 13 is a flow chart illustrating a method of verifying a repair result of a memory device according to exemplary implementations.

As described with reference to FIG. 1, a memory device may include a memory cell array and a control circuit. The memory cell array may include a normal region and a redundant region where the normal region includes a first failed block and the redundant region includes a first redundant block replacing the first failed block. The control circuit may include a test mode register and a mapping table storing replacement information between the first failed block and the first redundant block.

As shown in FIG. 13, a test mode register may be activated (S110) for a PPR test. When the memory device is tested after the memory device is packaged, the address signal and the command signal corresponding to a test mode are applied to the memory device and the control circuit may activate the test mode register.

Whether the normal region includes a second failed block may be determined (S120). The control circuit may perform read and write operations with respect to the memory cell array assigned to the address signal to determine if the normal region further includes the second failed block, as described with reference to FIG. 4.

A first logic value may be written in the normal region and the first redundant block and a second logic value may be written in the redundant region except the first redundant block (S130). When the normal region includes the second failed block, the replacement information between the second failed block and a second redundant block in the redundant region may be added to the mapping table (S140). When the normal region includes the second failed block, the result from replacing the second failed block with the second redundant block may be verified based on entire data read from the memory cell array with respect to an entire range assigned to the address signal (S150). The processes (S130, S140 and S150) may be understood as described with reference to FIGS. 4 through 9.

FIG. 14 is a diagram illustrating an example of adding replacement information to a mapping table in the method of FIG. 13.

As shown in FIG. 14, adding the replacement information between the second failed block and a second redundant block in the redundant region to the mapping table (S140) may include selecting the second redundant block among the redundant region except the first redundant block by referring to the mapping table (S141) as described with reference to FIG. 6.

FIG. 15 is a diagram illustrating an example of verifying the result of replacing a second failed block with a second redundant block in the method of FIG. 13.

As shown in FIG. 15, verifying the result of replacing the second failed block with the second redundant block (S150) may include, when all of the portion data corresponding to the second redundant block among the entire data have the second logic value and all of the rest of the data except the portion data among the entire data have the first logic value, determining that an error is not included in the result of replacing the second failed block with the second redundant block (S151), as described with reference to FIG. 8. In addition, verifying the result of replacing the second failed block with the second redundant block (S150) may include, when portion data corresponding to the second redundant block among the entire data have the first logic value or the rest of data except the portion data among the entire data have the second logic value, determining that an error is included in the result of replacing the second failed block with the second redundant block (S152), as described with reference to FIG. 9.

Figure 16:
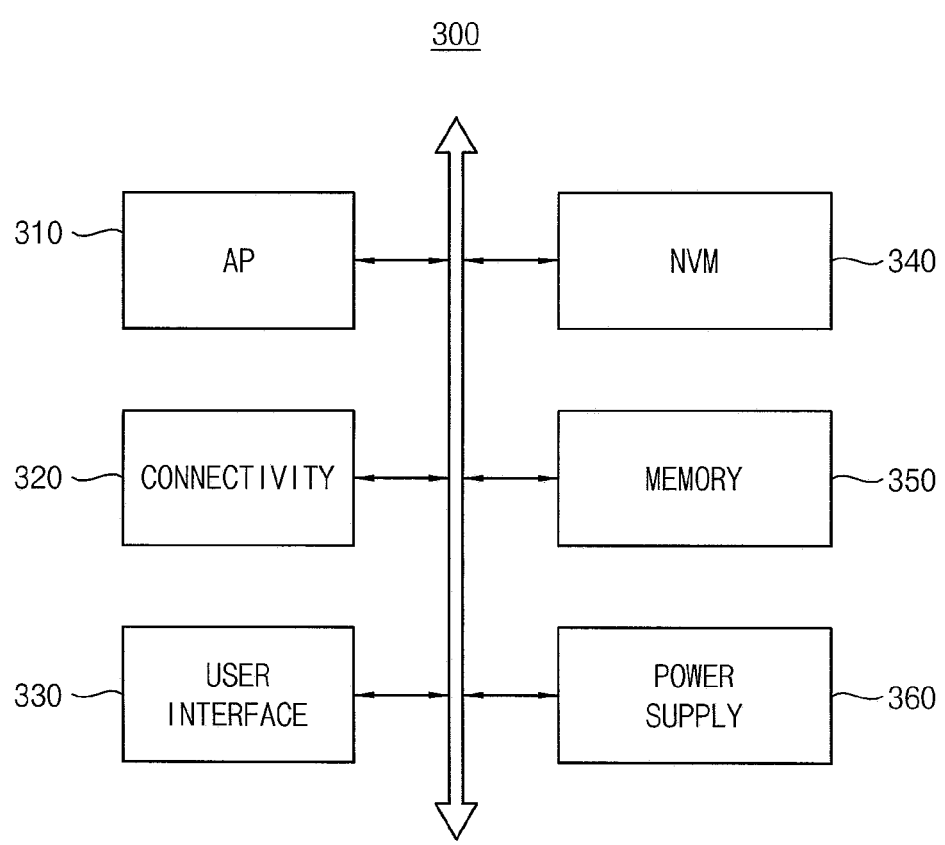
FIG. 16 is a block diagram illustrating a mobile system according to exemplary implementations.

FIG. 16 is a block diagram illustrating a mobile system according to exemplary implementations.

As shown in FIG. 16, a mobile system 300 includes an application processor (AP) 310, a connectivity unit 320, a user interface 330, a nonvolatile memory device (NVM) 340, a memory device 350 and a power supply 360. In some exemplary implementations, the mobile system 300 may be, for example, a mobile phone, a smart phone, a personal digital assistant (PDA), a portable multimedia player (PMP), a digital camera, a music player, a portable game console, a navigation system, or another type of electronic device.

The application processor 310 may execute applications such as a web browser, a game application, a video player, etc. In some exemplary implementations, the application processor 310 may include a single core or multiple cores. For example, the application processor 310 may be a multi-core processor such as a dual-core processor, a quad-core processor, a hexa-core processor, etc. The application processor 310 may include an internal or external cache memory.

The connectivity unit 320 may perform wired or wireless communication with an external device. For example, the connectivity unit 320 may perform Ethernet communication, near field communication (NFC), radio frequency identification (RFID) communication, mobile telecommunication, memory card communication, universal serial bus (USB) communication, etc. In some embodiments, connectivity unit 320 may include a baseband chipset that supports communications, such as global system for mobile communications (GSM), general packet radio service (GPRS), wideband code division multiple access (WCDMA), high speed downlink/uplink packet access (HSxPA), etc.

The memory device 350 may store data processed by the application processor 310, or may operate as a working memory. For example, the memory device 350 may be a dynamic random access memory, such as DDR SDRAM, LPDDR SDRAM, GDDR RDRAM, etc. The memory device 350 may be implemented with that of FIG. 1. The configuration and the operation of the memory device 350 are the same as described with reference to FIGS. 1 through 11.

The nonvolatile memory device 340 may store a boot image for booting the mobile system 300. For example, the nonvolatile memory device 340 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 330 may include at least one input device, such as a keypad, a touch screen, etc., and at least one output device, such as a speaker, a display device, etc. The power supply 360 may supply a power supply voltage to the mobile system 300. In some exemplary implementations, the mobile system 300 may further include a camera image processor (CIS), and/or a storage device, such as a memory card, a solid state drive (SSD), a hard disk drive (HDD), a CD-ROM, etc.

In some exemplary implementations, the mobile system 300 and/or components of the mobile system 300 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi-chip package (MCP), wafer-level fabricated package (WFP), wafer-level processed stack package (WSP), etc.

Figure 17:
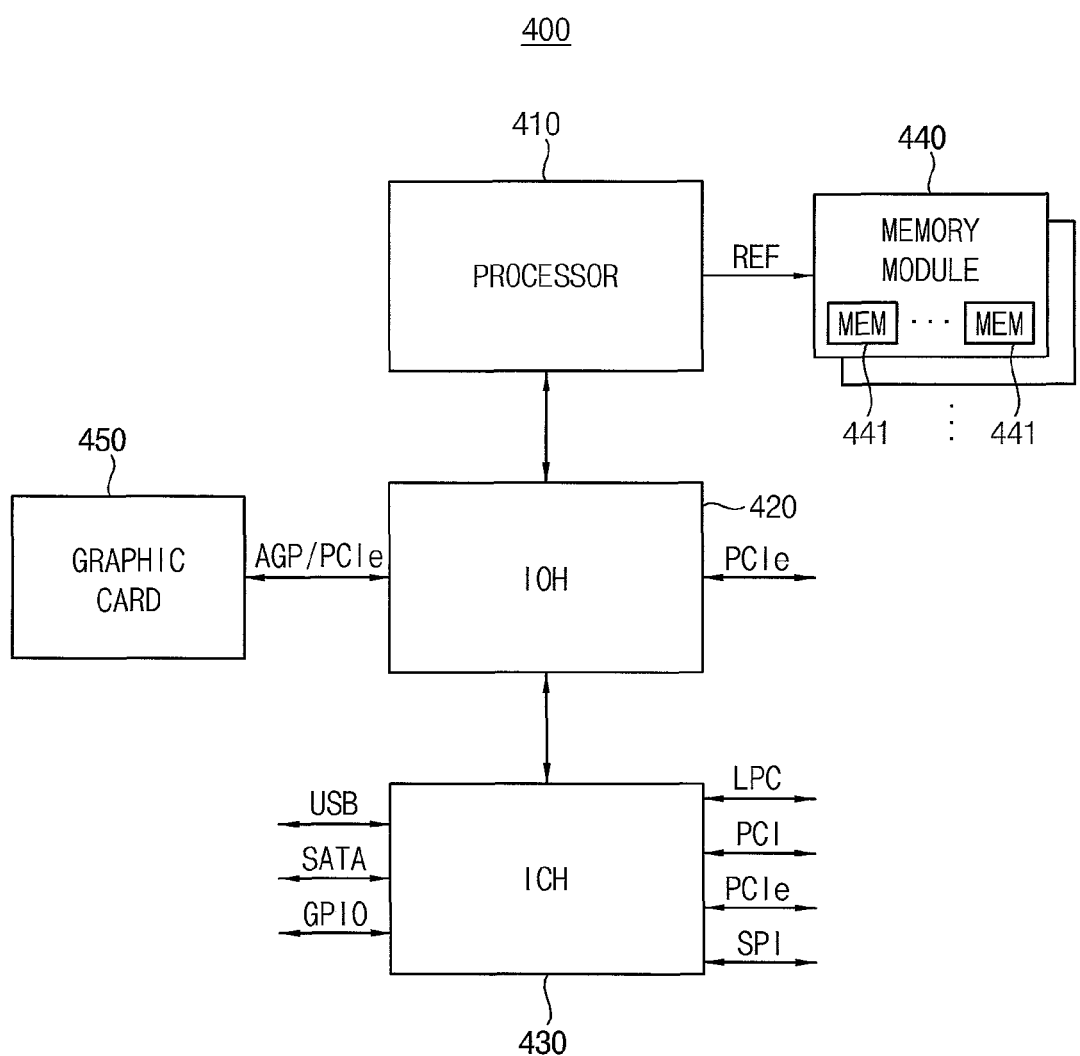
FIG. 17 is a block diagram illustrating a computing system according to exemplary implementations.

FIG. 17 is a block diagram illustrating a computing system according to exemplary implementations.

As shown in FIG. 17, a computing system 400 includes a processor 410, an input/output hub (IOH) 420, an input/output controller hub (ICH) 430, at least one memory module 440, and a graphics card 450. In some exemplary implementations, the computing system 400 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 410 may perform various computing functions such as executing specific software for performing specific calculations or tasks. For example, the processor 410 may be a microprocessor, a central process unit (CPU), a digital signal processor, or the like. In some exemplary implementations, the processor 410 may include a single core or multiple cores. For example, the processor 410 may be a multi-core processor, such as a dual-core processor, a quad-core processor, a hexa-core processor, etc. Although FIG. 17 illustrates the computing system 400 including one processor 410, in some embodiments, the computing system 400 may include a plurality of processors. The processor 410 may include an internal or external cache memory.

The processor 410 may include a memory controller for controlling operations of the memory module 440. The memory controller included in the processor 410 may be referred to as an integrated memory controller (IMC). A memory interface between the memory controller and the memory module 440 may be implemented with a single channel including a plurality of signal lines, or may be implemented with multiple channels, to each of which at least one memory module 440 may be coupled. In some exemplary implementations, the memory controller may be located inside the input/output hub 420, which may be referred to as memory controller hub (MCH).

The memory module 440 may include a plurality of memory devices that store data provided from the memory controller. The memory device may be implemented in accordance with that of FIG. 1. The configuration and the operation of the memory device are the same as described with reference to FIGS. 1 through 11.

The input/output hub 420 may manage data transfer between processor 410 and devices, such as the graphics card 450. The input/output hub 420 may be coupled to the processor 410 via various interfaces. For example, the interface between the processor 410 and the input/output hub 420 may be a front side bus (FSB), a system bus, a HyperTransport, a lightning data transport (LDT), a Quick-Path interconnect (QPI), a common system interface (CSI), etc. Although FIG. 17 illustrates the computing system 400 including one input/output hub 420, in some embodiments, the computing system 400 may include a plurality of input/output hubs. The input/output hub 420 may provide various interfaces with the devices. For example, the input/output hub 420 may provide an accelerated graphics port (AGP) interface, a peripheral component interface-express (PCIe), a communications streaming architecture (CSA) interface, etc.

The graphic card 450 may be coupled to the input/output hub 420 via AGP or PCIe. The graphics card 450 may control a display device (not shown) for displaying an image. The graphics card 450 may include an internal processor for processing image data and an internal memory device. In some exemplary implementations, the input/output hub 420 may include an internal graphics device along with or instead of the graphics card 450. The graphics device included in the input/output hub 420 may be referred to as integrated graphics. Further, the input/output hub 420 including the internal memory controller and the internal graphics device may be referred to as a graphics and memory controller hub (GMCH).

The input/output controller hub 430 may perform data buffering and interface arbitration to efficiently operate various system interfaces. The input/output controller hub 430 may be coupled to the input/output hub 420 via an internal bus, such as a direct media interface (DMI), a hub interface, an enterprise Southbridge interface (ESI), PCIe, etc. The input/output controller hub 430 may provide various interfaces with peripheral devices. For example, the input/output controller hub 430 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some exemplary implementations, the processor 410, the input/output hub 420 and the input/output controller hub 430 may be implemented as separate chipsets or separate integrated units. In other exemplary implementations, at least two of the processor 410, the input/output hub 420 and the input/output controller hub 430 may be implemented as a single chipset. Also, while many features are disclosed as units, in other exemplary implementations those features may be implemented as other forms of logic including but not limited to code-based operations performed by a processor.

The present disclosure may be applied to arbitrary devices and systems including a memory device. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of exemplary implementations and is not to be construed as limiting thereof. Although a few exemplary implementations have been described, those skilled in the art will readily appreciate that many modifications are possible without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary implementations and is not to be construed as limited to the specific exemplary implementations disclosed, and that modifications to the disclosed exemplary implementations, as well as other exemplary implementations, are intended to be included within the scope of the appended claims.

What is claimed is:

1. A memory device comprising:
    a memory cell array including a normal region having a plurality of memory cells and a redundant region having a plurality of redundant memory cells, the normal region including a first failed block, the redundant region including a first redundant block replacing the first failed block; and
    a control circuit including a mapping table storing replacement information regarding the first failed block and the first redundant block, the control circuit configured to refer to the mapping table and access the first redundant block when an address signal corresponds to the first failed block,
    in a test mode of the memory device, wherein the normal region further includes a second failed block, the control circuit is configured to:
        write a first logic value in all the memory cells of the normal region other than memory cells of the first and second failed blocks and in redundant memory cells of the first redundant block,
        write a second logic value different from the first logic value in all the redundant memory cells of the redundant region other than the redundant memory cells of the first redundant block,
        store replacement information regarding the second failed block and a second redundant block in the redundant region in the mapping table, the second redundant block replacing the second failed block, and
        verify a result of replacing the second failed block with the second redundant block based on data read from all of redundant memory cells in the second redundant block.

2. The memory device of claim 1, wherein, when data read from all the redundant memory cells of the second redundant block have the second logic value and all of data read from the normal region and the first redundant block have the first logic value, the memory device is configured such that the control circuit determines that an error is not included in the result of replacing the second failed block with the second redundant block.

3. The memory device of claim 1, wherein, when at least a first data read from the second redundant block has the first logic value or at least a second data read from the normal region and the first redundant block has the second logic value, the memory device is configured such that the control circuit determines that an error is included in the result of replacing the second failed block with the second redundant block.

4. The memory device of claim 1, wherein the control circuit refers to the mapping table to select the second redundant block in the redundant region except the first redundant block.

5. The memory device of claim 1, wherein the normal region includes a plurality of normal sub regions and each of the first failed block and the second failed block is located in a corresponding sub region of the normal sub regions, and
    wherein the redundant region includes a plurality of redundant sub regions and each of the first redundant block and the second redundant block is located in a corresponding redundant sub region of the redundant sub regions.

6. The memory device of claim 1, wherein the control circuit further includes a test mode register, and
    wherein, when a command signal and the address signal corresponding to the test mode of the memory device are received, the test mode register is activated.

7. The memory device of claim 1,
    wherein the control circuit is configured to convert the address signal to a first internal address signal and to convert a data signal to a first internal data signal to access the normal region by the first internal address signal and the first internal data signal, and
    wherein the control circuit is configured to convert the address signal to a second internal address signal and to convert the data signal to a second internal data signal to access the redundant region by the second internal address signal and the second internal data signal.

8. The memory device of claim 1, wherein the first logic value is 1 and the second logic value is 0.

9. The memory device of claim 1, wherein the first logic value is 0 and the second logic value is 1.

10. The memory device of claim 1, wherein the first failed block includes one or more failed memory cells connected to a first wordline in the normal region and the second failed block includes one or more failed memory cells connected to a second wordline in the normal region.

11. The memory device of claim 10, wherein the redundant memory cells of the first redundant block are connected to a third wordline in the redundant region and the redundant memory cells of the second redundant block are connected to a fourth wordline in the redundant region.

12. A memory system comprising:
a memory device; and
a processor configured to provide an address signal, a data signal and a command signal to the memory device,
wherein the memory device comprises:
a memory cell array including a normal region having a plurality of memory cells and a redundant region having a plurality of redundant memory cells, the normal region including a first failed block, the redundant region including a first redundant block replacing the first failed block; and
a control circuit including a mapping table storing replacement information regarding the first failed block and the first redundant block, the control circuit configured to refer to the mapping table and access the first redundant block when the address signal corresponds to the first failed block,
in a test mode of the memory device, wherein the normal region further includes a second failed block, the control circuit is configured to:
write a first logic value in all the memory cells of the normal region other than memory cells of the first and second failed blocks and in redundant memory cells of the first redundant block,
write a second logic value different from the first logic value in all the redundant memory cells of the redundant region other than the redundant memory cells of the first redundant block,
add replacement information regarding the second failed block and a second redundant block in the redundant region to the mapping table, the second redundant block replacing the second failed block, and
verify a result of replacing the second failed block with the second redundant block based on data read from all of redundant memory cells in the second redundant block to generate a verification result signal.

13. The memory system of claim 12, wherein, when data read from all the redundant memory cells of the second redundant block have the second logic value and all of data read from the normal region and the first redundant block have the first logic value, the memory device is configured such that the control circuit determines that an error is not included in the result of replacing the second failed block with the second redundant block and activates the verification result signal.

14. The memory system of claim 12, wherein, when at least a first data read from the second redundant block has the first logic value or at least a second data read from the normal region and the first redundant block has the second logic value, the memory device is configured such that the control circuit determines that an error is included in the result of replacing the second failed block with the second redundant block and deactivates the verification result signal.

15. The memory system of claim 12, wherein the control circuit further includes a test mode register, and
wherein, when the command signal and the address signal corresponding to the test mode of the memory device are received from the processor, the test mode register is activated.

16. The memory system of claim 12,
wherein the control circuit is configured to convert the address signal to a first internal address signal and to convert a data signal to a first internal data signal to access the normal region by the first internal address signal and the first internal data signal, and
wherein the control circuit is configured to convert the address signal to a second internal address signal and to convert the data signal to a second internal data signal to access the redundant region by the second internal address signal and the second internal data signal.

17. A method of verifying a repair result of a memory device comprising a memory cell array including a normal region having a plurality of memory cells and a redundant region having a plurality of redundant memory cells where the normal region includes a first failed block and the redundant region includes a first redundant block replacing the first failed block and comprising a control circuit including a mapping table storing replacement information regarding the first failed block and the first redundant block, the method comprising:
determining whether the normal region further includes a second failed block in a test mode of the memory device;
when the normal region is determined to include the second failed block in the test mode:
writing a first logic value in all the memory cells of the normal region other than memory cells of the first and second failed blocks and in redundant memory cells of the first redundant block;
writing a second logic value different from the first logic value in all the redundant memory cells of the redundant region other than the redundant memory cells of the first redundant block;
adding replacement information regarding the second failed block and a second redundant block in the redundant region to the mapping table, the second redundant block replacing the second failed block; and
verifying a result of replacing the second failed block with the second redundant block based on data read from all of redundant memory cells in the second redundant block.

18. The method of claim 17, wherein the adding of the replacement information includes:
selecting the second redundant block in the redundant region except the first redundant block by referring to the mapping table.

19. The method of claim 17, wherein the verifying of the result of replacing the second failed block with the second redundant block includes:
when data read from all the redundant memory cells of the second redundant block have the second logic value and all of data read from the normal region and the first redundant block have the first logic value, determining that an error is not included in the result of replacing the second failed block with the second redundant block.

20. The method of claim 17, wherein the verifying of the result of replacing the second failed block with the second redundant block includes:
when at least a first data read from the second redundant block has the first logic value or at least a second data read from the normal region and the first redundant block has the second logic value, determining that an error is included in the result of replacing the second failed block with the second redundant block.

* * * * *